United States Patent
Yokogawa et al.

(10) Patent No.: US 11,447,869 B2
(45) Date of Patent: Sep. 20, 2022

(54) MANUFACTURING METHOD FOR SOLAR CELL, SOLAR CELL, AND SOLAR CELL MANUFACTURING APPARATUS

(71) Applicant: MITSUBISHI ELECTRIC CORPORATION, Tokyo (JP)

(72) Inventors: Masahiro Yokogawa, Tokyo (JP); Takahiro Kawasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 557 days.

(21) Appl. No.: 15/750,658

(22) PCT Filed: Sep. 20, 2016

(86) PCT No.: PCT/JP2016/077682
§ 371 (c)(1),
(2) Date: Feb. 6, 2018

(87) PCT Pub. No.: WO2017/068900
PCT Pub. Date: Apr. 27, 2017

(65) Prior Publication Data
US 2019/0186005 A1 Jun. 20, 2019

(30) Foreign Application Priority Data
Oct. 20, 2015 (JP) .............................. JP2015-206569

(51) Int. Cl.
*C23C 16/458* (2006.01)
*H01L 31/0216* (2014.01)
*H01L 31/18* (2006.01)

(52) U.S. Cl.
CPC ...... *C23C 16/4586* (2013.01); *C23C 16/4585* (2013.01); *H01L 31/02168* (2013.01);
(Continued)

(58) Field of Classification Search
CPC ............ C23C 16/4585; C23C 16/4586; H01L 31/02168; H01L 31/1804
See application file for complete search history.

(56) References Cited

U.S. PATENT DOCUMENTS

5,203,958 A * 4/1993 Arai ................. H01L 21/67069
216/67
2008/0277885 A1 * 11/2008 Duff .................. H01L 21/67109
279/3
(Continued)

FOREIGN PATENT DOCUMENTS

JP 2000-21960 A 1/2000
JP 2005-085657 A 3/2005
(Continued)

OTHER PUBLICATIONS

Office Action dated Jul. 3, 2020, by the Chinese Patent Office in corresponding Chinese Patent Application No. 201680060879.6 and English translation of the Office Action. (15 pages).
(Continued)

*Primary Examiner* — Brigitte A Paterson
(74) *Attorney, Agent, or Firm* — Buchanan Ingersoll & Rooney PC

(57) ABSTRACT

A method includes: forming an n-type diffusion layer as a second-conductivity-type semiconductor layer on a first-conductivity-type crystalline semiconductor substrate; and forming an anti-reflective film by a CVD method to extend from a light receiving surface side to a side surface of the semiconductor substrate, by placing the semiconductor substrate on a mount in a film forming chamber with a back surface brought into contact with the mount, evacuating and decompressing the film forming chamber, and supplying source gas into the film forming chamber. In the film formation, a tray has a through hole, and the anti-reflective film is formed on the surface of the semiconductor substrate
(Continued)

excluding the contact surface by bringing the semiconductor substrate into close contact with the contact surface by causing the through hole to have a negative pressure relative to the pressure in the film forming chamber by the evacuation.

11 Claims, 12 Drawing Sheets

(52) U.S. Cl.
CPC ........ *H01L 31/1804* (2013.01); *Y02E 10/547* (2013.01); *Y02P 70/50* (2015.11)

(56) References Cited

U.S. PATENT DOCUMENTS

| | | | | |
|---|---|---|---|---|
| 2008/0296740 | A1* | 12/2008 | Kawano | ............ H01L 23/3192 257/635 |
| 2009/0269490 | A1* | 10/2009 | Moriyama | .......... C23C 16/4412 427/240 |
| 2009/0277502 | A1 | 11/2009 | Yoshida et al. | |
| 2015/0136221 | A1* | 5/2015 | Miyazaki | ............ H01L 31/0203 136/256 |

FOREIGN PATENT DOCUMENTS

| | | |
|---|---|---|
| JP | 2007-197745 A | 8/2007 |
| JP | 2008-010500 A | 1/2008 |
| JP | 2010-123627 A | 6/2010 |
| JP | 2012-209316 A | 10/2012 |
| JP | 2017-108083 A | 6/2017 |
| WO | WO 2007/119673 A1 | 10/2007 |
| WO | WO 2013/051323 A1 | 4/2013 |

OTHER PUBLICATIONS

International Search Report (PCT/ISA/210) dated Dec. 20, 2016, by the Japanese Patent Office as the International Searching Authority for International Application No. PCT/JP2016/077682.
Written Opinion (PCT/ISA/237) dated Dec. 20, 2016, by the Japanese Patent Office as the International Searching Authority for International Application No. PCT/JP2016/077682.
Office Action dated Aug. 30, 2017, by the Taiwanese Patent Office for Application No. 105133236.
Office Action (Notification of Reasons for Refusal) dated Sep. 4, 2018, by the Japanese Patent Office in corresponding Japanese Patent Application No. 2017-546457 and English translation of the Office Action. (9 pages).
Office Action (Decision of Refusal) dated Jan. 29, 2019, by the Japan Patent Office in corresponding Japanese Patent Application No. 2017-546457 and English translation of the Office Action. (5 pages).
Office Action dated Apr. 9, 2021, by the Chinese Patent Office in corresponding Chinese Patent Application No. 201680060879.6 and English translation of the Office Action. (15 pages).
Office Action dated Sep. 3, 2021, in corresponding Chinese Patent Application No. 201680060879.6 and English translation of the Office Action. (13 pages).
Office Action dated Feb. 25, 2022, issued by the German Patent and Trademark Office in corresponding German Patent Application No. 112016004804.1 and an English translation of the Action. (20 pages).

* cited by examiner

MANUFACTURING METHOD FOR SOLAR CELL, SOLAR CELL, AND SOLAR CELL MANUFACTURING APPARATUS

FIELD

The present invention relates to a manufacturing method for a solar cell, a solar cell, and a solar cell manufacturing apparatus, and in particular to formation of a thin film on a solar cell.

BACKGROUND

A typical manufacturing method for a solar cell using single crystal silicon or polycrystalline silicon employs thermal diffusion to diffuse an n-type impurity such as phosphorus into a p-type silicon substrate and form a p-n junction, in which case a phosphorus silicon glass (PSG) layer having n-type conductivity is also deposited on the end of the substrate at the same time. The PSG layer remaining on the end of the substrate causes electrical leakage and reduces cell characteristics. Thus, the PSG layer on the end of the substrate is etched in order to isolate the p-n junction. A reactive ion etching (RIE) method has been widely used as a method of etching the PSG layer on the end of the substrate.

After the p-n junction is isolated in such a manner, a thin film called an anti-reflective film is usually deposited or grown on a light receiving surface in order to efficiently absorb incident light. The anti-reflective film is formed of a single layer or a combination of two or more layers of a thin film of silicon oxide ($SiO_2$), silicon nitride ($Si_3N_4$), titanium oxide ($TiO_2$), magnesium fluoride (MgF), aluminum oxide ($Al_2O_3$), tantalum oxide ($Ta_2O_5$), zinc sulfide ($ZnSO_4$), or the like having a thickness of around several tens to 100 nm. Among them, the silicon nitride film has the composition of $Si_3N_4$ stoichiometrically but is denoted as $SiN_x$ in some cases because the ratio of silicon (Si) to nitrogen (N) in the film can be controlled depending on the formation conditions. The silicon nitride film can have a different refractive index relatively easily by the formation conditions, thereby having a wider range of application than other substances. A chemical vapor deposition (CVD) apparatus capable of forming the $SiN_x$ film at high speed has been developed and attracted interest.

On the other hand, the anti-reflective film formed by the CVD apparatus may be wrapped around to a side surface or other surfaces of a semiconductor substrate to result in reduced characteristics. Patent Literature 1 thus discloses a film forming method which prevents the anti-reflective film formed on one surface of a semiconductor substrate from being undesirably wrapped around to a side surface or other surfaces thereof.

Patent Literature 1 prevents the anti-reflective film from being wrapped around to the side surface or other surfaces of the semiconductor substrate by providing a substrate holder frame in a CVD apparatus used for forming the anti-reflective film.

Other methods include a method of simultaneously removing the PSG layer and the anti-reflective film physically by laser or blasting after forming the anti-reflective film, and a method of wet etching the PSG layer.

Patent Literature 2 isolates the p-n junction by forming a p-n isolation groove with a laser after formation of the anti-reflective film and physically cutting off the p layer from the n layer at the end of the semiconductor substrate.

CITATION LIST

Patent Literature

Patent Literature 1: Japanese Patent Application Laid-open No. 2007-197745
Patent Literature 2: Japanese Patent Application Laid-open No. 2012-209316

SUMMARY

Technical Problem

However, the following problems occur when the cell structures of Patent Literatures 1 and 2 are used to try to prevent a reduction in the characteristics caused by the wraparound of the anti-reflective film. For example, Patent Literature 1 prevents the wraparound by providing the frame to the substrate holder installed in the CVD apparatus. This can prevent the wraparound of the CVD film but reduces an effective area because a region without the anti-reflective film has no anti-reflective effect or substrate termination effect, namely, the passivation effect. Patent Literature 2 has a problem of reducing the characteristics because the substrate is damaged when the isolation groove is formed with the laser.

Patent Literatures 1 and 2 both reduce the effective area as a solar cell and may damage the substrate, and at the same time increase the number of manufacturing processes to increase manufacturing cost.

The present invention has been made in view of the above problems, and an object thereof is to obtain a solar cell that prevents a reduction in the characteristics caused by wraparound of a thin film, such as an anti-reflective film, without increasing the number of manufacturing processes.

Solution to Problem

In order to solve the above-mentioned problems and achieve the object, an aspect of the present invention includes: a step of forming a semiconductor layer of a second conductivity type on a crystalline semiconductor substrate of a first conductivity type; and a step of forming an anti-reflective film by a CVD method such that the anti-reflective film extends from a light receiving surface side of the semiconductor substrate to a side surface of the semiconductor substrate, by placing the semiconductor substrate on a mount provided in a film forming chamber with a back surface of the semiconductor substrate brought into contact with the mount, by evacuating and decompressing the film forming chamber, and by supplying a source gas into the film forming chamber. The mount has a through hole that has an opening in a contact surface with the semiconductor substrate and passes through the mount. The step of forming the anti-reflective film is a step of forming the anti-reflective film on the surface of the semiconductor substrate excluding the contact surface by bringing the semiconductor substrate into close contact with the contact surface by causing the through hole to have a negative pressure relative to the pressure in the film forming chamber by the evacuation.

Advantageous Effects of Invention

The present invention can obtain a solar cell that prevents a reduction in the characteristics caused by wraparound of a thin film, such as an anti-reflective film, without increasing the number of manufacturing processes.

DESCRIPTION OF EMBODIMENTS

Figure 1:
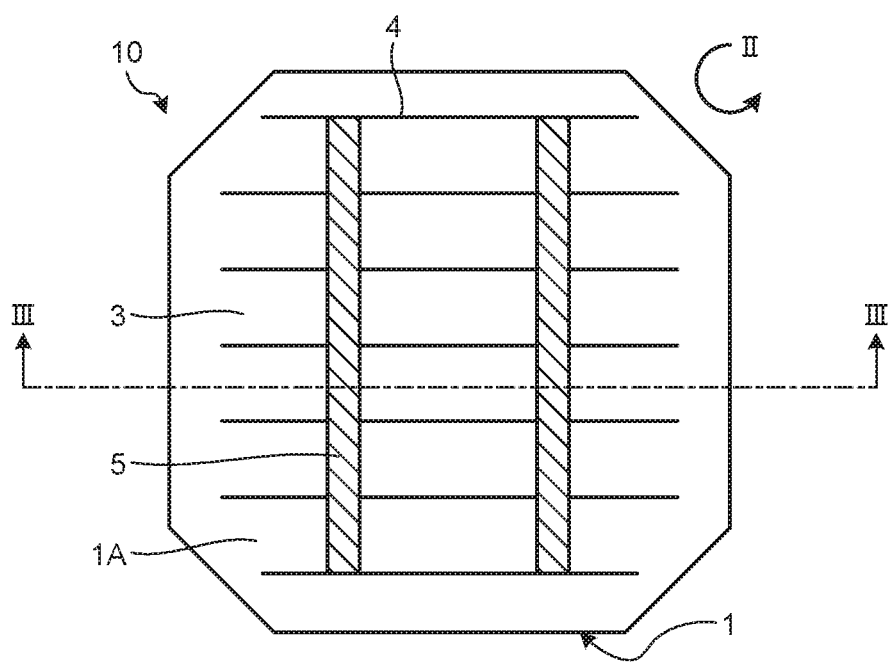
FIG. 1 is a plan view illustrating the appearance of a light receiving surface side of a solar cell according to a first embodiment.

Embodiments of a solar cell according to the present invention will now be described in detail with reference to the drawings. Note that the present invention is not limited to the embodiments but can be modified as appropriate without departing from the scope of the present invention. The scale of each member in the drawing may be different from the actual scale in order to facilitate understanding. The scaling also holds true for the relationships between the drawings.

First Embodiment

Figure 2:
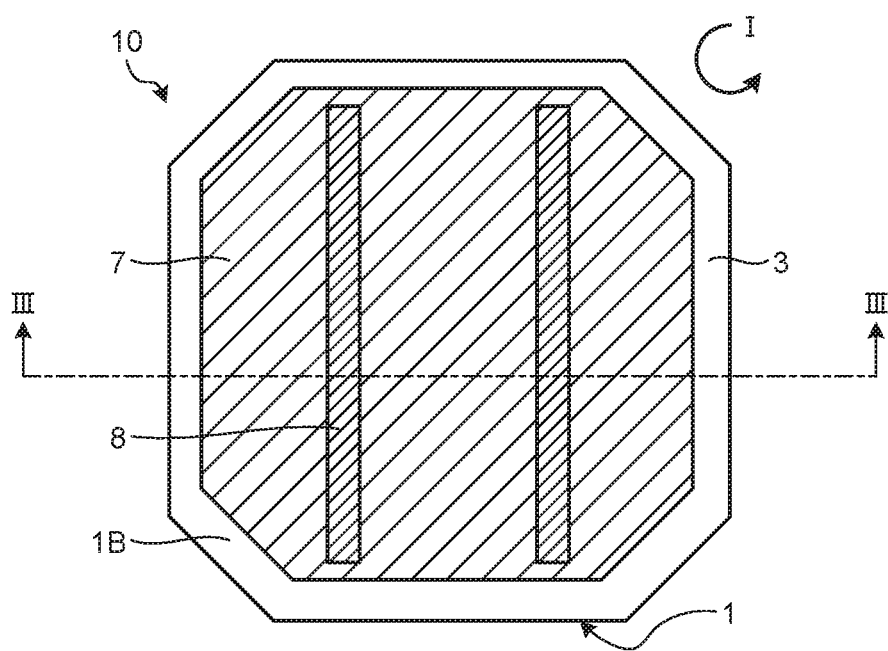
FIG. 2 is a plan view illustrating the appearance of a back surface side of the solar cell.
Figure 3:
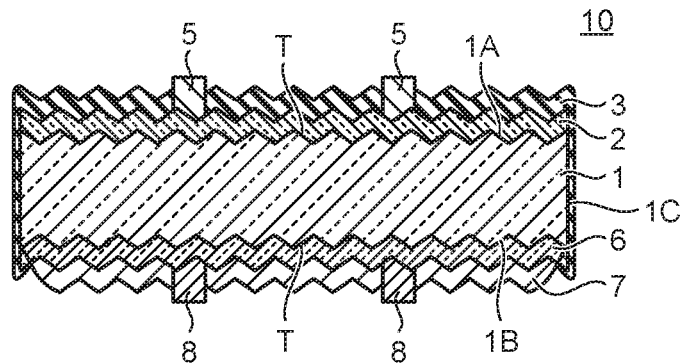
FIG. 3 is a sectional view corresponding to a cross section taken along line III-III of FIG. 1 and along line III-III of FIG. 2.

A manufacturing method for a solar cell according to a first embodiment is characterized by a method of fixing a substrate used in forming an anti-reflective film. A mount on which the substrate is placed has a through hole that has an opening in a surface in contact with the substrate, passes through the mount, and opens into a film forming chamber at the other end of the hole. The through hole provided in part of the contact surface between the mount and the substrate thus has a negative pressure relative to the surrounding in a process of decompressing the film forming chamber before the start of film formation, whereby the substrate is attracted to and brought into close contact with the mount. FIG. 1 illustrates a solar cell according to the first embodiment and is a plan view illustrating the appearance of a light receiving surface side of the solar cell, FIG. 2 is a plan view illustrating the appearance of a back surface side of the solar cell, and FIG. 3 is a sectional view corresponding to a cross section taken along line III-III of FIG. 1 and along line III-III of FIG. 2. In a solar cell 10 of the first embodiment, a light receiving surface 1A, which is a first main surface of a p-type single crystal silicon substrate 1, and a back surface 1B, which is a second main surface opposite the first main surface, have surface irregularities called texture T formed to a depth of about 10 μm to confine light, the p-type single crystal silicon substrate 1 functioning as a crystalline semiconductor substrate of a first conductivity type.

As illustrated in FIG. 3, the p-type single crystal silicon substrate 1 includes the light receiving surface 1A; the back surface 1B; and a side surface 1C located between the light receiving surface 1A and the back surface 1B to connect the light receiving surface 1A and the back surface 1B. The back surface 1B is a surface located on the back side of the light receiving surface 1A and has substantially the same shape as the light receiving surface 1A. In the first embodiment, the planar shapes of the light receiving surface 1A and the back surface 1B are of pseudo-square wafers or squares. An n-type diffusion layer 2, which is a semiconductor layer of a second conductivity type with a thickness of 0.2 μm, is formed on a surface of the texture T on the side where the light receiving surface 1A of the p-type single crystal silicon substrate 1 is located, thereby forming a p-n junction. An anti-reflective film 3 made of a silicon nitride film is formed on the n-type diffusion layer 2 to reduce reflection and increase light availability.

A light receiving surface electrode including a large number of thin finger electrodes 4 and several thick bus electrodes 5 orthogonal to the finger electrodes 4 is formed in the opening of the anti-reflective film 3 on the surface corresponding to the light receiving surface 1A. In the first embodiment, the anti-reflective film 3 is a silicon nitride film that has a film thickness of 55 nm to 60 nm and is selectively formed only on the side where the light receiving surface 1A is located by a CVD method. The anti-reflective film 3 is selectively formed only on the light receiving surface 1A and the side surface 1C without being formed on the back surface 1B. The irregularities of the texture T formed on the surface of the p-type single crystal silicon substrate 1 are exaggerated in order to enhance viewability.

The p-type single crystal silicon substrate 1 is formed of a crystalline silicon substrate made of single crystal silicon, polycrystalline silicon, or the like. The p-type single crystal silicon substrate 1 is a rectangular flat plate with a side length of about 150 mm to 160 mm and a thickness of about 150 μm to 250 μm, for example. A p-n junction region in which p-type silicon is joined to n-type silicon is formed on the outer peripheral surface of the p-type single crystal silicon substrate 1. That is, the p-n junction region is provided along the outer peripheral surface of the p-type single crystal silicon substrate 1 from the light receiving surface 1A to the side surface 1C and the outer periphery of the back surface 1B. More specifically, the p-n junction region is provided on substantially the entire surface of the light receiving surface 1A, substantially the entire surface of the side surface 1C, and the outer periphery of the back surface 1B in which the light receiving surface electrode, namely the finger electrodes 4 and the bus electrodes 5, is not provided.

As illustrated in FIG. 1, electrodes formed on the side where the light receiving surface 1A is located include the bus electrodes 5 and the finger electrodes 4 as n-type electrodes. The bus electrodes 5 are wide, each having a width of about 1 mm to 3 mm, where about two to four electrodes 5 are provided substantially parallel to one another on the light receiving surface 1A. A large number of the finger electrodes 4 are provided on the light receiving surface 1A at a pitch of about 1 mm to 5 mm to intersect the bus electrodes 5 substantially perpendicularly thereto. The width of each of the finger electrodes 4 can be about 20 μm to 200 μm. The thickness of each of the bus electrodes 5 and the finger electrodes 4 is set to about 10 μm to 20 μm.

As illustrated in FIG. 2, electrodes formed on the side where the back surface 1B is located include a back surface collector electrode 7 and output extraction electrodes 8 as p-type electrodes. The back surface collector electrode 7 is formed on substantially the entire surface of the back surface 1B of the p-type single crystal silicon substrate 1, which is a semiconductor substrate, except for the outer periphery of the back surface. There are two to four output extraction electrodes 8, each of which has a width of about 2 mm to 5 mm and extends, on the back surface 1B, in the same direction as the direction of extension of the bus electrodes 5. At least part of the output extraction electrodes 8 is in electrical contact with the back surface collector electrode 7. The output extraction electrodes 8 can have a thickness of about 10 μm to 20 μm, and the back surface collector electrode 7 can have a thickness of about 15 μm to 50 μm.

The finger electrodes 4 and the back surface collector electrode 7 have a role of collecting photo-generated carriers. The bus electrodes 5 and the output extraction electrodes 8 have a role of collecting the carriers collected by the finger electrodes 4 and the back surface collector electrode 7 and outputting the carriers as electric power to the outside.

As described above, the p-n junction region is provided on the outer periphery of the back surface 1B where the back surface collector electrode 7 is not provided. The back surface collector electrode 7 is thus provided adjacent to the p-n junction region on the back surface 1B.

In the first embodiment, the light receiving surface 1A and the outer peripheral end of the back surface 1B of the p-type single crystal silicon substrate 1 are etched by a dry etching apparatus in order to perform p-n isolation.

Light entering the solar cell element of the above configuration from the light receiving surface 1A is absorbed by the p-type single crystal silicon substrate 1, which is a semiconductor substrate, and is photoelectrically converted to generate electron-hole pairs, or electron carriers and hole carriers. The photo-generated carriers, which are the electron carriers and hole carriers due to photoexcitation, are gathered in the above-described electrodes provided on the light receiving surface 1A and the back surface 1B of the solar cell element by the action of the p-n junction region, whereby a potential difference is generated between the electrodes.

<Manufacturing Method for Solar Cell According to First Embodiment>

Figure 4:
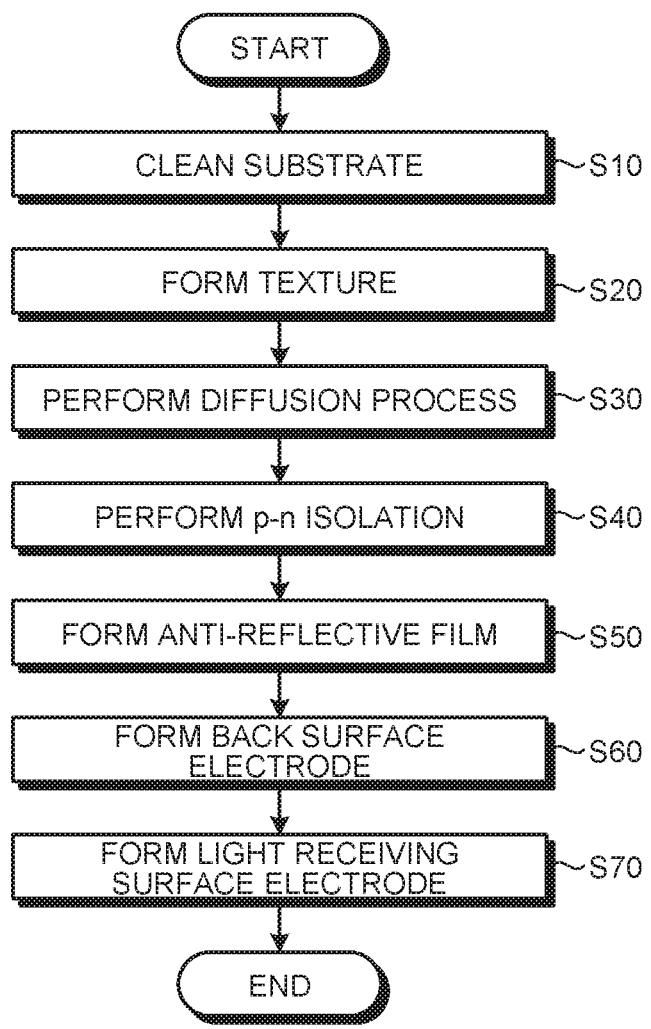
FIG. 4 is a flowchart illustrating a manufacturing method for a solar cell according to a first embodiment.

Next, a manufacturing method for a solar cell according to the first embodiment will be described. FIG. 4 is a flowchart illustrating the manufacturing method for a solar cell according to the first embodiment, and FIGS. 5(a) to 5(g) are sectional process diagrams.

First, for example, a silicon ingot is sliced to obtain the p-type single crystal silicon substrate 1 having a plate shape as illustrated in FIG. 5(a). The p-type single crystal silicon substrate 1 can be made of p-type single crystal or polycrystalline silicon. For example, the p-type single crystal silicon substrate 1 having a p-type conductivity and resistivity of about 0.2 Ω·cm to 2.0 Ω·cm can be obtained by adding trace amounts of impurities such as boron (B) to the silicon.

More specifically, the semiconductor substrate formed of a single crystal semiconductor substrate is made by a pulling method such as the Czochralski method. The semiconductor substrate formed of a polycrystalline semiconductor substrate is made by slicing a silicon ingot produced by a casting method or the like to have a thickness of 350 μm or less, more preferably about 150 μm to 250 μm, with the use of a wire saw or the like.

The shape of the p-type single crystal silicon substrate 1 may be circular, square, or rectangular, and the size of the substrate may be about 100 mm to 200 mm in diameter in the case of a circle, or about 100 mm to 200 mm on one side in the case of a square or a rectangle. The p-type single crystal silicon substrate 1 in any shape includes the light receiving surface 1A, the back surface 1B, and the side surface 1C as described above.

Immediately after slicing, a damaged layer in the order of several microns to several tens of microns caused by the slicing is formed on the surface of the p-type single crystal silicon substrate 1, where fine contaminants generated at the time of the slicing adhere to the surface of the damaged layer. Thus, in substrate cleaning step S10, the p-type single crystal silicon substrate 1 is immersed in an alkaline aqueous solution of sodium hydroxide (NaOH) or potassium hydroxide (KOH) to remove the damaged layer and remove the contaminants, and then the substrate is rinsed and dried.

In many cases, as illustrated in FIG. 5(b), the texture T is formed in texture forming step S20 by wet etching using an alkaline solution and an additive for the purpose of reducing a light reflection loss on the surface of the substrate. Alternatively, irregularities of 1 μm to 3 μm may be formed on the surface of the substrate by a dry etching process such as RIE. Potassium hydroxide or sodium hydroxide is used as the alkaline solution, and isopropyl alcohol is used as the additive.

Next, as illustrated in FIG. 5(c), a diffusion process is performed in diffusion process step S30 to form a p-n junction in the p-type single crystal silicon substrate 1. That is, a group V element such as phosphorus (P) is diffused to the p-type single crystal silicon substrate 1 to form the n-type diffusion layer 2. Here, the p-n junction is formed by vapor phase diffusion by which phosphorus is thermally diffused to the p-type single crystal silicon substrate 1, which has the texture formed on the surface thereof, at a high temperature in phosphorus oxychloride ($POCl_3$) gas. That is, the n-type diffusion layer 2 is formed across the light receiving surface 1A, the side surface 1C, and the back surface 1B of the p-type single crystal silicon substrate 1. Phosphorus (P) can be used as the n-type doping element. The n-type diffusion layer 2 can be an n-type layer having a sheet resistance of about 30Ω/□ to 150Ω/□. The p-n junction is thus formed between the p-type single crystal silicon substrate 1, which is the p-type bulk region, and the n-type diffusion layer 2. The use of such a method allows the n-type diffusion layer 2 to be formed at a depth of about 0.2 μm to 0.7 μm in the surface of the p-type single crystal silicon substrate 1.

Thereafter, only the end of the substrate is etched by a dry etching apparatus as illustrated in FIG. 5(d) in p-n isolation step S40 with only the end of the substrate being exposed, preferably with only the end of the substrate being exposed upon placing the front surface and the back surface of a plurality of substrates on top of each other. The state in which the front surface and the back surface of the plurality of substrates are placed on top of each other is hereinafter referred to as a "stack". The end of the substrate is etched in order to perform p-n isolation of isolating the light receiving surface 1A and the back surface 1B into the p-type and the n-type from the state where the n-type layer as the diffusion layer is formed on the entire surface of the substrate. The entire surface of the substrate in this case includes the light receiving surface, the back surface, and the end. A method of rendering the back surface to be the p-type will be described later. Other than the method of using the dry etching apparatus, the p-n isolation is performed by a chemical removal method such as a wet etching method, a physical removal method such as the method using a laser as in Patent Literature 2, or a combination of the chemical removal method and the physical removal method.

Following the p-n isolation performed by dry etching, the anti-reflective film 3 is formed on the light receiving surface 1A as illustrated in FIG. 5(e) in anti-reflective film formation step S50. The anti-reflective film 3 is formed to extend from the light receiving surface 1A to the outer periphery of the back surface 1B through the side surface 1C. The anti-reflective film 3 is formed of the most common, silicon nitride film, or a $SiN_x$ film. The $SiN_x$ film is the silicon nitride film with a varying composition ratio (x) centered around $Si_3N_4$ which is in a stoichiometric state, or in which the ratio (composition) of the number of atoms making up the SiN compound agrees with a chemical formula. Here, the anti-reflective film 3 is formed to have a thickness in the range of approximately 40 μm to 100 μm by using a solar cell manufacturing apparatus that is a CVD apparatus. As for the p-type single crystal silicon substrate 1 made of silicon, for example, the refractive index of the anti-reflective film 3 is about 1.8 to 2.3, or about 2.1 in the first embodiment.

Figure 6:
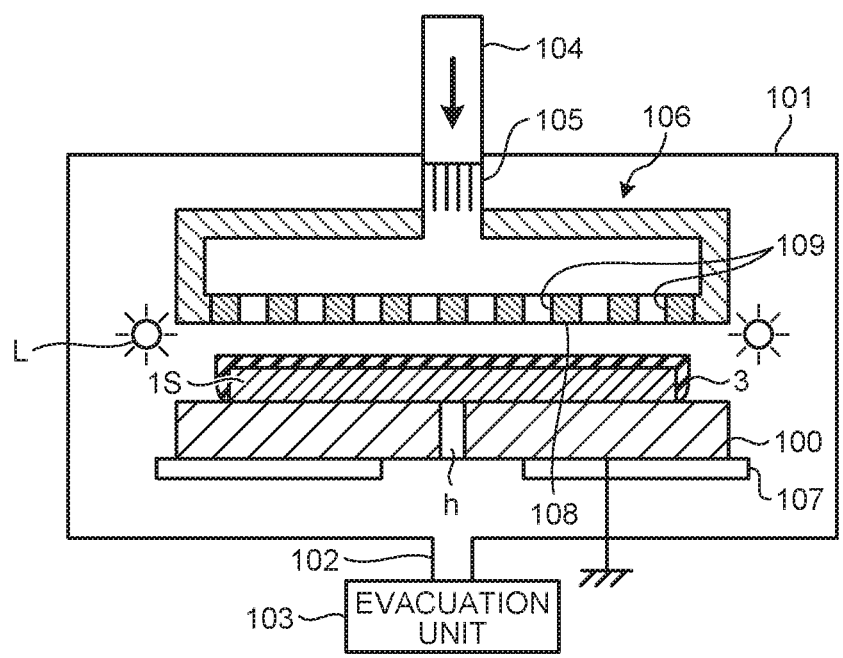
FIG. 6 is a view illustrating a solar cell manufacturing apparatus that includes a film forming device that employs a CVD method and is used in the manufacturing method for a solar cell according to the first embodiment.
Figure 7:
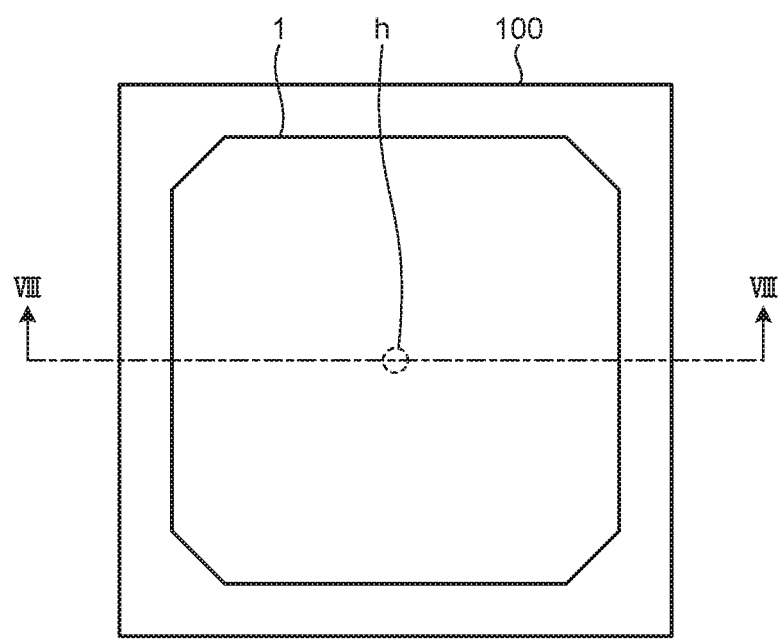
FIG. 7 is a top view illustrating a tray and a substrate on the tray in the solar cell manufacturing apparatus according to the first embodiment.

The anti-reflective film 3 is formed by using a solar cell manufacturing apparatus illustrated in FIG. 6 that is semiconductor manufacturing apparatus including a film forming apparatus that employs the CVD method. As illustrated in FIG. 7 that is a top view of the substrate placed on the tray in the solar cell manufacturing apparatus of the first embodiment and FIG. 8 that is a sectional view taken along line VIII of FIG. 7, the solar cell manufacturing apparatus includes the through hole h formed in part of the contact surface between a tray 100 and a substrate 1S so that, when the anti-reflective film 3 is formed, the through hole h having a narrow opening allows a substance to flow therethrough faster than in the atmosphere to have a negative pressure relative to the surrounding in a decompression process preceding the film formation, whereby the substrate 1S can be attracted to and brought into close contact with the tray 100. The silicon nitride film is thus not formed on the back surface of the substrate 1S. Here, the substrate 1S is formed of a semiconductor substrate such as the p-type single crystal silicon substrate 1 in which a p-n junction is formed.

The through hole h is typically formed near the center of the substrate 1S. If the substrate 1S and the tray 100 are offset from each other due to manufacturing variations, this causes uneven adhesion therebetween, whereby a satisfactory effect may not be obtained in some cases. A plurality of the through holes h may thus be provided, preferably symmetrically about the center of the substrate 1S as much as possible.

FIG. 6 is a diagram schematically illustrating an example of the configuration of a plasma CVD apparatus according to the first embodiment of the present invention. The plasma CVD apparatus includes a film forming chamber 101 that forms therein an atmosphere for forming a thin film. The film forming chamber 101 is provided with an evacuation portion 102, to which an evacuation unit 103 such as a vacuum pump is connected. The evacuation unit 103 evacuates the gas from the film forming chamber 101, so that the film forming chamber 101 is set to a predetermined degree of vacuum. The film forming chamber 101 includes therein the tray 100 that constitutes a stage; a gas supply portion 104 supplying a film forming gas; a diffusion chamber 105 diffusing the gas; and a showerhead electrode 106 as a plasma electrode. The showerhead electrode 106 and the tray 100 are disposed such that their surfaces face each other are parallel to each other. Note that the tray 100 functions as a counter electrode and a substrate holder, and is placed on a support base 107 that is electrically grounded.

The tray 100 is placed on the support base 107 to be electrically grounded, and holds the substrate 1S to be subjected to the film forming process. The showerhead electrode 106 includes a plurality of outlets 109 formed in a facing surface 108 facing the tray 100. When source gas is supplied into the film forming chamber 101 through the outlets 109 and high frequency power is supplied to the showerhead electrode 106, plasma is generated between the electrodes. The source gas supplied from the gas supply portion 104 through the diffusion chamber 105 is dissociated in the plasma to form a desired film (a silicon nitride film in the present embodiment) on the substrate 1S placed on the tray 100 in the film forming chamber 101. Note that the other configurations for forming the silicon nitride film on the substrate 1S may be similar to those of a conventional plasma CVD apparatus; therefore, detailed description and illustration thereof are omitted.

Figure 8:
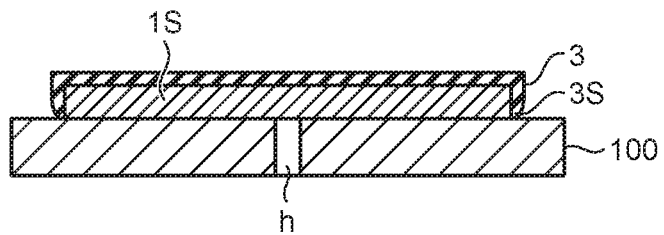
FIG. 8 is a sectional view taken along line VIII of FIG. 7 and illustrating the tray and the substrate on the tray in the solar cell manufacturing apparatus according to the first embodiment.
Figure 9:
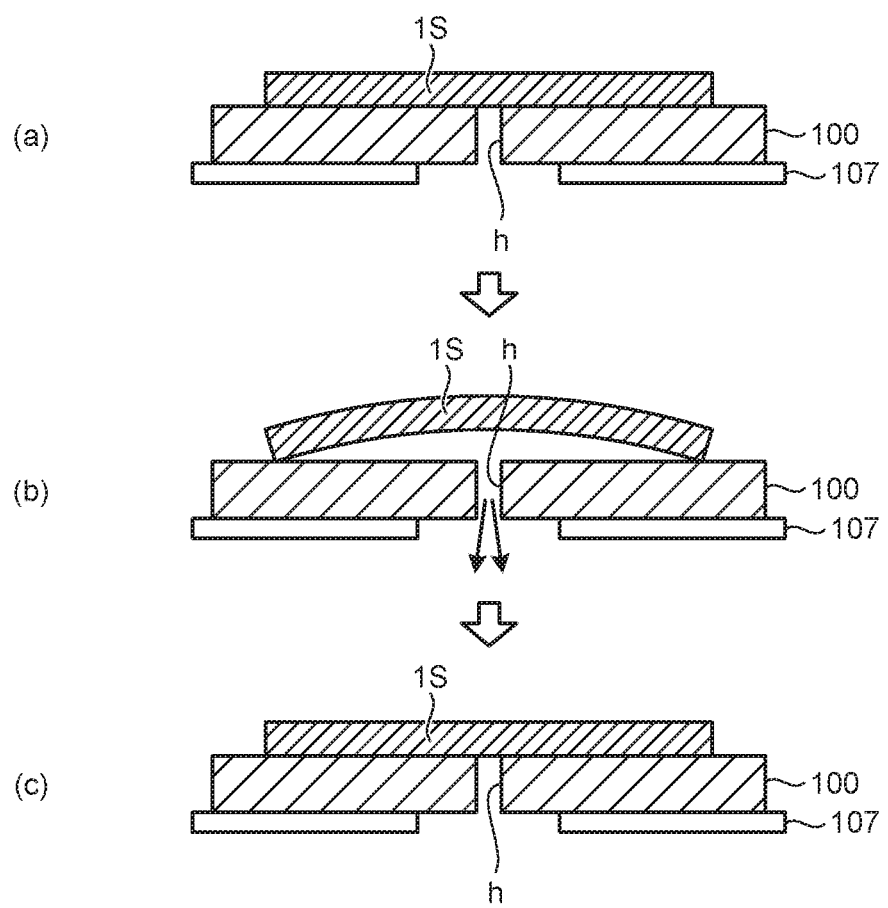
FIGS. 9(a) to 9(c) are sectional state diagrams illustrating placement of the substrate up to film formation in the processes of forming an anti-reflective film using the solar cell manufacturing apparatus according to the first embodiment.

The processes of forming an anti-reflective film by using the plasma CVD apparatus as illustrated in FIGS. 6 to 8 will be described. Prior to film formation, the p-type single crystal silicon substrate 1 with the p-n junction formed therein is used as the substrate 1S and placed on the tray 100 as illustrated in FIGS. 7 and 8. The substrate 1S is placed such that the through hole h is positioned at the center of the substrate 1S. FIGS. 9(*a*) to 9(*c*) are sectional state diagrams illustrating placement of the substrate 1S up to film formation in the processes of forming the anti-reflective film 3 by the plasma CVD apparatus.

The tray 100 on which the substrate 1S is placed is placed on the support base 107 as illustrated in FIG. 9(*a*), and the film forming chamber 101 is evacuated by the evacuation unit 103 to about $10^{-3}$ Torr to $10^{-5}$ Torr, or about $10^{-1}$ Pa to $10^{-3}$ Pa. In this case, the first embodiment uses a lamp L to rapidly heat the substrate 1S and increase the temperature up to the film forming temperature in about one minute from the time the substrate 1S is placed in the film forming chamber 101, thereby forming the film immediately upon supplying the source gas. At this time, warpage occurs in the substrate 1S as illustrated in FIG. 9(*b*) due to the difference in the coefficient of thermal expansion, thereby allowing the source gas to be more likely to go around through the gap. However, after the substrate 1S is placed on the tray 100, the through hole h formed in the tray 100 has a negative pressure in the process of evacuating the film forming chamber 101 by the evacuation unit 103; therefore, the substrate 1S is immediately attracted and fixed to the tray 100 with good adhesion as illustrated in FIG. 9(*c*). This prevents the gas plasma from going around by the supply of source gas and can thus avoid film formation on the back surface.

At this time, the film forming chamber 101 is first decompressed to a first pressure in a first decompression process to allow the through hole h to have a negative pressure relative to the pressure in the film forming chamber 101. The pressure is then further reduced to a second pressure in a second decompression process so that the semiconductor substrate is brought into close contact with the tray 100 as a mount. The source gas is thereafter supplied into the film forming chamber 101. This source gas supplying process adjusts the supply of the source gas to maintain the pressure at or below the first pressure, which is the pressure in the film forming chamber 101 in the first decompression process. The pressure is further reduced in the second decompression process to allow the substrate 1S to be fixed to the tray 100 with good adhesion. The substrate 1S can thus remain fixed to the tray 100 with good adhesion even when the source gas is supplied in the next process to cause an increase in the pressure. At this time, the substrate 1S can more reliably remain fixed to the tray 100 with good adhesion by adjusting the supply of the source gas so as not to exceed the first pressure that is the initial pressure.

The pressure rises from the reduced pressure to the atmospheric pressure after the film formation, whereby a reverse phenomenon occurs in the substrate 1S. That is, gas such as nitrogen $N_2$ or air flows into the contact surface between the substrate 1S and the tray 100 through the through hole h. The substrate 1S is thus released from the tray 100; therefore, the substrate 1S can be easily withdrawn into a storage carrier.

As described above, the pressure in the film forming chamber is adjusted to allow the semiconductor substrate in close contact with the mount to remain fixed thereto and to allow film formation to be performed. Thus, the anti-reflective film having high reliability can be formed without any wraparound on the back surface.

Wraparound of the $SiN_x$ film causes a reduction of characteristics, mainly, a fill factor (FF) due to an increase in dark current Id. The increase in the dark current Id means insufficient isolation of the p-n junction. A CVD $SiN_x$ film formed by the plasma CVD apparatus that is typically used to form the anti-reflective film of a solar cell has a certain degree of conductivity. Therefore, an increase of the dark current Id is thought to be caused by the wraparound of the $SiN_x$ film to the back surface that is the region of the second conductivity type such as the p type from the light receiving surface that is the region of the first conductivity type such as the n type.

The inventors of the present invention found out that, with an extremely simple configuration of opening the through hole h in the tray 100 of the CVD apparatus as illustrated in FIGS. 7 and 8, the through hole h can have a negative pressure at the time of evacuating the CVD apparatus. When the anti-reflective film 3 is formed using the rapid heating method, the substrate 1S is fixed to the surface of the tray 100 with good adhesion. Thus, the gas plasma can be prevented from flowing around to the back surface 1B of the substrate 1S and thus prevent formation of a silicon nitride film on the back surface. As a result, the anti-reflective film 3 need not be isolated physically; therefore, an effect is obtained where a reduction in the characteristics caused by wraparound of the film can be prevented without increasing the number of processes of manufacturing the solar cell.

Note that the above method can highly reliably avoid film formation on the back surface particularly when the substrate is likely to warp at the time of rapid heating. Besides lamp heating, the rapid heating method includes high-frequency heating by which the temperature can be raised to the film forming temperature in a very short time. Therefore, with the use of the method in the first embodiment, the extremely simple configuration in which the through hole h is formed in the tray 100 can prevent the anti-reflective film 3 from being wrapped around to the back surface 1B by allowing the substrate 1S to be in close contact with the tray 100 without causing warpage in the substrate 1S even by the rapid heating. The configuration is simple as the through hole h or a groove V need only be formed in the tray 100 that constitutes the mount without separately providing a suction device to fix the substrate 1S. Furthermore, the tray 100 does not require complicated processing and thus a reduction in flatness such as warpage in the tray 100 can be inhibited. Even when a thin substrate is used, there is no risk of breakage of the thin substrate by abrupt suction, and the through hole h that is a narrow opening in the substrate 1S allows a substance to flow faster therethrough than in the atmosphere; therefore, the through hole h has a negative pressure therein to allow the substrate 1S to be attracted to and brought into close contact with the tray 100. The substrate 1S can be brought into close contact with the tray 100 not only when the rapid heating method is used but when a common heating method is used, whereby film formation on the back surface can be avoided reliably.

As illustrated in FIG. 8, the anti-reflective film 3 obtained as described above has no supply of the source gas from the tray at the end of the side surface, namely at the interface with the tray, thereby forming a thin portion 3S having a gentle surface. In contrast, when the anti-reflective film 3 on the back surface is removed by etching, the end becomes steep. The end of the anti-reflective film 3 is gentle at the interface between the back surface and the side surface to thus cause no stepping when a passivation film, wiring, or the like is formed on the anti-reflective film 3.

As a subsequent process that is a common process, in back surface electrode forming step S60, the back surface collector electrode 7 and the output extraction electrodes 8 are formed on the back surface 1B of the p-type single crystal silicon substrate 1 as illustrated in FIG. 5(f). The back surface collector electrode 7 is formed by applying an aluminum-based paste all over the back surface 1B. After the paste is applied, the paste is fired at a temperature of about 700° C. to 900° C. to bake the aluminum on the p-type single crystal silicon substrate 1. The aluminum paste being applied is printed and fired so that a high concentration of aluminum as a p-type impurity can be diffused into the area of the p-type single crystal silicon substrate 1 in which the paste is applied, and the n-type diffusion layer 2 formed on the back surface 1B can be inverted to be replaced by a BSF layer 6 that is a heavily doped p-type layer. The heavily doped p-type layer formed on the back surface 1B serves as a contact layer for the back surface collector electrode 7.

Figure 5:
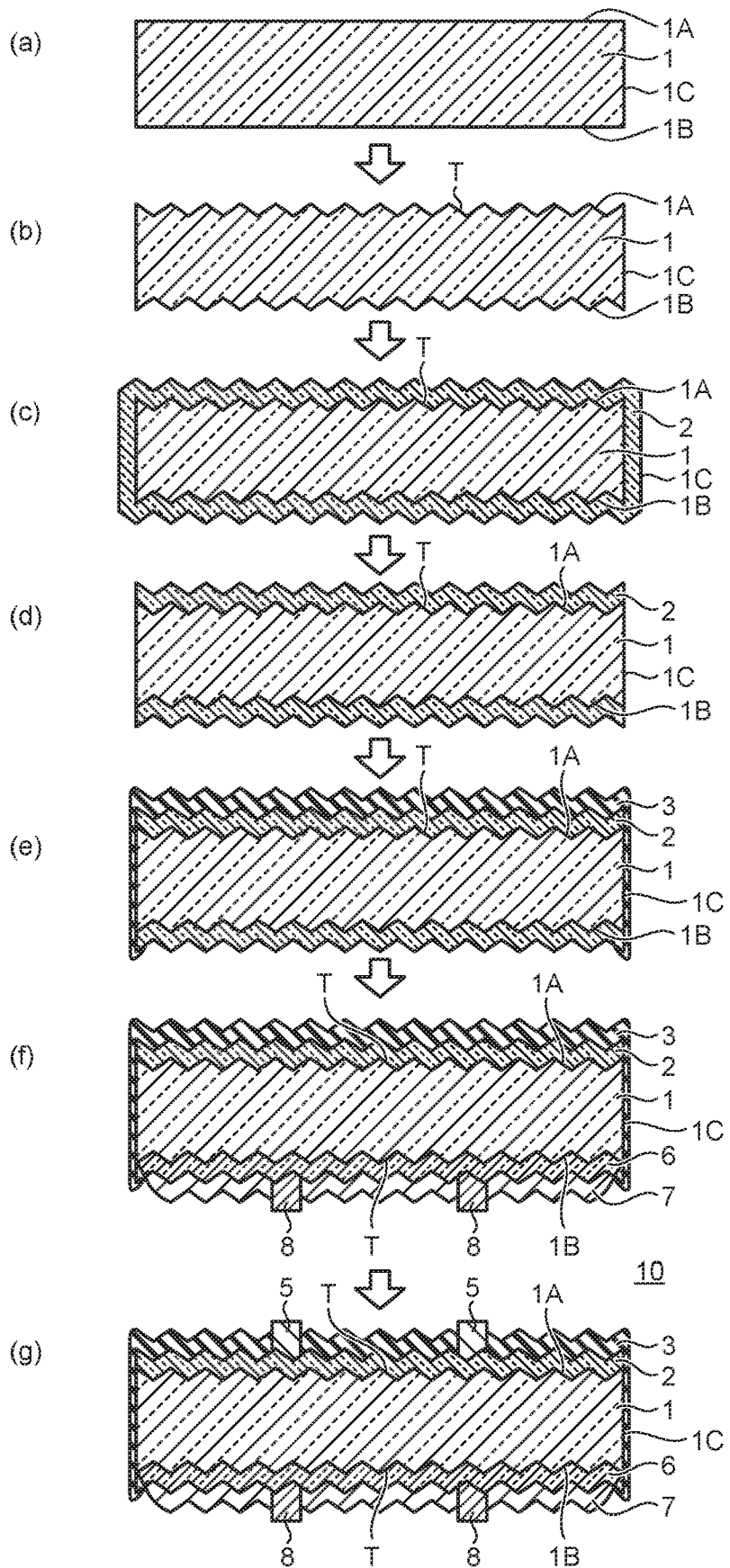
FIGS. 5(a) to 5(g) are sectional process diagrams illustrating the manufacturing method for a solar cell according to the first embodiment.

Next, in light receiving surface electrode forming step S70, the electrodes positioned on the light receiving surface 1A, i.e., the bus electrodes 5 and the finger electrodes 4 (not illustrated in FIG. 5), are formed, as illustrated in FIG. 5(g). The bus electrodes 5 and the finger electrodes 4 are obtained by firing at a maximum temperature of 500° C. to 650° C. for about several tens of seconds to several tens of minutes in a firing furnace.

The output extraction electrodes 8 on the back surface 1B as well as the bus electrodes 5 and the finger electrodes 4, which are the light receiving surface electrode, are formed by applying a silver-based conductive paste. The silver-based conductive paste can, for example, be obtained by mixing and kneading 100 parts by weight of silver filler with 5 to 30 parts by weight of an organic vehicle and 0.1 to 15 parts by weight of glass frit and adjusting the viscosity to about 50 Pa·s to 200 Pa·s with a solvent.

A printing method such as screen printing can be used as a method of applying the conductive paste, and the solvent may be evaporated at a certain temperature after application of the paste and then dried. The output extraction electrodes 8 on the back surface 1B may be dried after printing and then baked simultaneously with the bus electrodes 5 and the finger electrodes 4 on the light receiving surface 1A. As a result, the heat treatment process that is a high-temperature process need only be performed once; therefore, productivity can be improved.

Next, the bus electrodes 5 and the finger electrodes 4 are formed as the electrodes on the light receiving surface 1A of the p-type single crystal silicon substrate 1. The bus electrodes 5 and the finger electrodes 4 can also be formed by applying the silver-based conductive paste by the printing method such as screen printing as described above, and then drying and firing the paste. The solar cell 10 can be manufactured through the above processes.

The solar cell 10 with a satisfactory FF characteristic can thus be obtained by using the silicon nitride film formed by the CVD method as the anti-reflective film 3 without causing wraparound of the anti-reflective film 3 to the back surface 1B. Moreover, the solar cell can be manufactured extremely easily and with good work performance.

Second Embodiment

Figure 10:
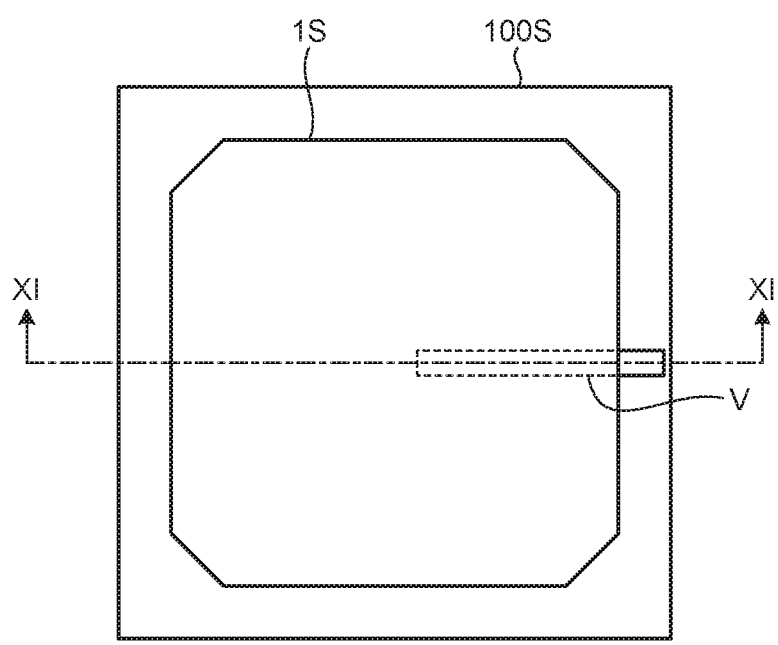
FIG. 10 is a top view illustrating a tray and a substrate on the tray in a solar cell manufacturing apparatus according to a second embodiment.
Figure 11:
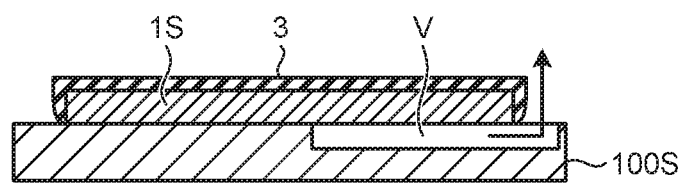
FIG. 11 is a sectional view taken along line XI of FIG. 10 and illustrating the tray and the substrate on the tray in the solar cell manufacturing apparatus according to the second embodiment.

In a manufacturing method for a solar cell according to a second embodiment, the groove V extending from the center of the substrate to the end thereof is provided on part of the contact surface between a tray 100S and the substrate 1S of the CVD apparatus that is used at the time of forming the anti-reflective film 3, as illustrated in FIGS. 10 and 11. FIG. 10 is a top view illustrating the tray and the substrate placed on the tray, and FIG. 11 is a sectional view taken along line XI of FIG. 10.

In this case as well, the tray 100S on which the substrate 1S is placed is placed on the support base 107 of the CVD apparatus illustrated in FIG. 9, and the film forming chamber 101 is evacuated by the evacuation unit 103. The groove V formed on the tray 100S thus has a negative pressure to allow the substrate 1S to be immediately attracted and fixed to the tray 100S with good adhesion. This prevents gas plasma from going around by the supply of source gas and can avoid film formation on the back surface 1B.

The second embodiment can cause the substrate 1S to be brought into close contact with the upper surface of the tray 100S by placing the tray 100S directly on a common support base, allowing a substance to evacuate through the gap formed between the substrate 1S and the upper surface of the tray 100S, and generating the negative pressure in the groove V.

Therefore, in addition to the effect of the first embodiment, the groove need only be formed on the tray without any change in the design of the CVD apparatus; therefore, the existing CVD apparatus can be used as is. The substrate in the CVD apparatus of the first embodiment receives, substantially at a single point, a relatively strong adhesion force in the vertical direction through the through hole; therefore, a very thin substrate with a thickness of about 200 μm may possibly crack. In the second embodiment, a weak adhesion force acts along the surface of the substrate in the shape of the groove V, thereby reducing a probability of cracking of a thin substrate.

Third Embodiment

Figure 12:
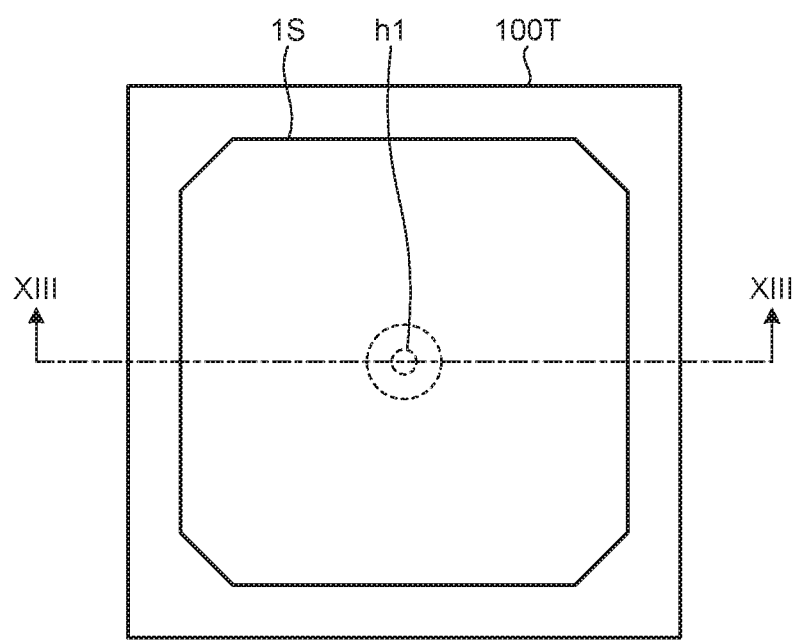
FIG. 12 is a top view illustrating a tray and a substrate on the tray in the solar cell manufacturing apparatus according to a third embodiment.
Figure 13:
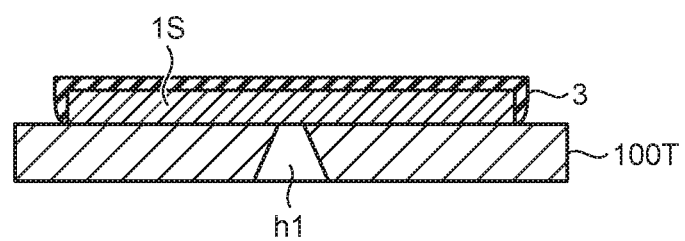
FIG. 13 is a sectional view taken along line XIII of FIG. 12 and illustrating the tray and the substrate on the tray in the solar cell manufacturing apparatus according to the third embodiment.

In a manufacturing method for a solar cell according to a third embodiment, a through hole hl formed in a tray 100T of the CVD apparatus used at the time of forming the anti-reflective film 3 is a tapered hole having a larger cross-sectional area as the hole is farther away from the substrate 1S, as illustrated in FIGS. 12 and 13. The other configurations are similar to those of the first embodiment. FIG. 12 is a top view illustrating the tray and the substrate placed on the tray, and FIG. 13 is a sectional view taken along line XIII of FIG. 12.

Such a configuration can further enhance adhesiveness; therefore, the adhesion between the tray 100T and the substrate 1S can be improved.

Fourth Embodiment

Figure 14:
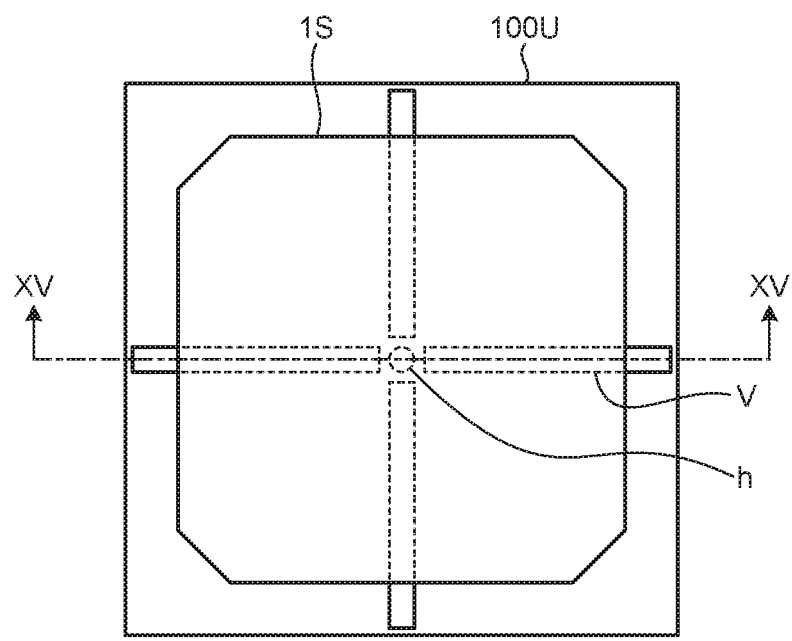
FIG. 14 is a top view illustrating a tray and a substrate on the tray in a solar cell manufacturing apparatus according to a fourth embodiment.
Figure 15:
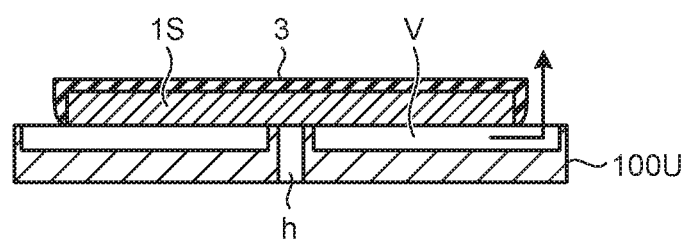
FIG. 15 is a sectional view taken along line XV of FIG. 14 and illustrating the tray and the substrate on the tray in the solar cell manufacturing apparatus according to the fourth embodiment.

In a manufacturing method for a solar cell according to a fourth embodiment, the through hole h and four grooves V are formed in a tray 100U of the CVD apparatus used at the time of forming the anti-reflective film 3, as illustrated in FIGS. 14 and 15. The four grooves V are provided on a main surface of the tray 100U. The other configurations are similar to those of the first embodiment. FIG. 14 is a top view illustrating the tray and the substrate placed on the tray, and FIG. 15 is a sectional view taken along line XV of FIG. 14.

The manufacturing method for a solar cell according to the fourth embodiment combines the first embodiment and the second embodiment so as to be able to obtain the effects of both the first embodiment and the second embodiment, the effects being more than what can be obtained by individually implementing the embodiments. Comparing the first and second embodiments, for example, the substrate 1S in the CVD apparatus of the first embodiment receives, substantially at a single point, a relatively strong adhesion force in the vertical direction, whereas in the CVD apparatus of the second embodiment, a weak adhesion force acts in the shape of the grooves V, i.e., a weak adhesion force acts on the surface. The relatively strong force acts on one point in the first embodiment alone; therefore, a crack may occur in a very thin substrate with a thickness of about 200 μm. On the other hand, in the second embodiment, the adhesion force is weak; therefore, a sufficient effect may not be obtained. The fourth embodiment therefore has a synergistic effect such that a good balance of both of the effects can be obtained.

Fifth Embodiment

Figure 16:
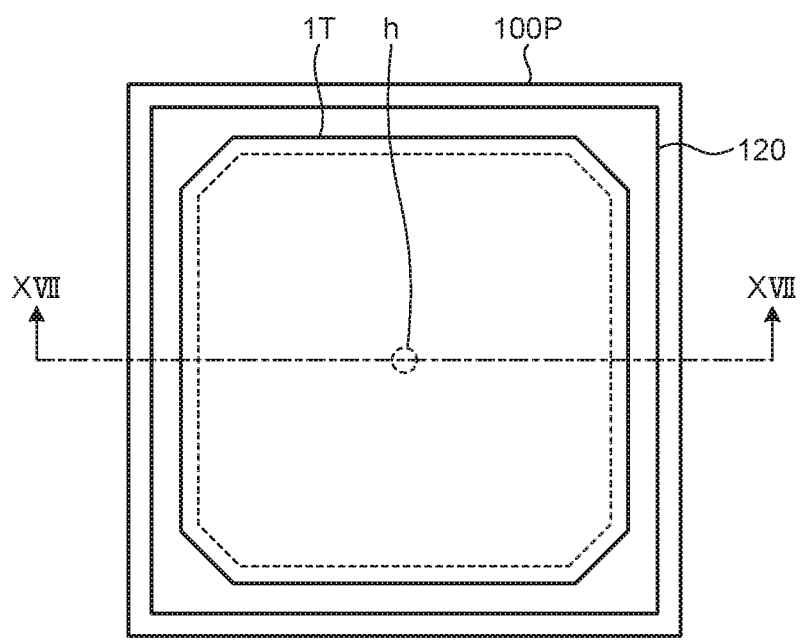
FIG. 16 is a top view illustrating a tray and a substrate on the tray in the solar cell manufacturing apparatus according to a fifth embodiment.

Although the above embodiments describe the diffused solar cell, it is obvious that the present invention can also be applied to a heterojunction solar cell where a p-n junction is formed by forming an amorphous silicon i-layer and an amorphous silicon n-layer on a p-type single crystal silicon substrate, for example. For the heterojunction solar cell, a protrusion TS may be formed on the periphery of a substrate 1T due to the wraparound of the amorphous silicon i-layer and the amorphous silicon n-layer to the back surface of the substrate. The adhesion to the surface of a tray may be poor in this case. A fifth embodiment will describe a method and an apparatus for forming the anti-reflective film 3 when the protrusion TS is formed on the periphery. FIG. 16 is a top view illustrating the tray and the substrate placed on the tray in a solar cell manufacturing apparatus of the fifth embodiment, and FIG. 17 is a sectional view taken along line XVII of FIG. 16 and illustrating the tray and the substrate placed on the tray in the solar cell manufacturing apparatus of the fifth embodiment.

Figure 17:
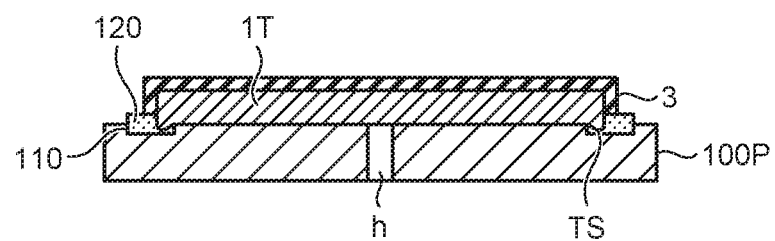
FIG. 17 is a sectional view taken along line XVII of FIG. 16 and illustrating the tray and the substrate on the tray in the solar cell manufacturing apparatus according to the fifth embodiment.

As illustrated in FIGS. 16 and 17, a manufacturing method for a solar cell according to the fifth embodiment forms the through hole h in a tray 100P of the CVD apparatus used at the time of forming the anti-reflective film 3, forms a recessed groove 110 in a region corresponding to the periphery of the substrate 1T, and fits an elastic body 120 made of a refractory metal mesh into the recessed groove 110. The other configurations are similar to those of the first embodiment. Here, the substrate 1T is formed of a semiconductor substrate such as the p-type single crystal silicon substrate in which a p-n junction is formed. The amorphous silicon i-layer and the amorphous silicon n-layer are formed on the p-type single crystal silicon substrate by the CVD method, in which case as well the substrate 1T is placed on the tray 100P such that the through hole h is positioned at the center of the substrate 1T, whereby the film is formed by using the solar cell manufacturing apparatus as illustrated in FIGS. 16 and 17 to prevent wraparound of the layer to the back surface.

Figure 18:
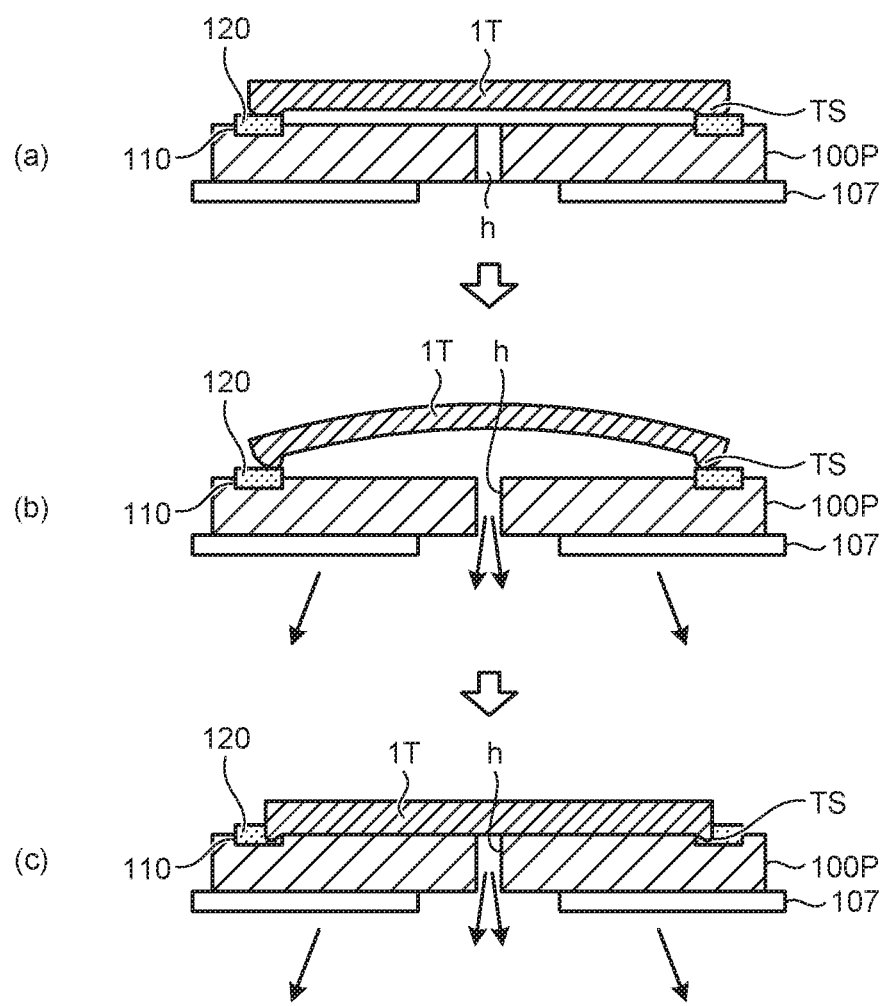
FIGS. 18(a) to 18(c) are sectional state diagrams illustrating placement of the substrate up to film formation in the processes of forming an anti-reflective film using the solar cell manufacturing apparatus according to the fifth embodiment.

The processes of forming the anti-reflective film by using the tray of the fifth embodiment in the plasma CVD apparatus illustrated in FIG. 6 will be described. Prior to film formation, the p-type single crystal silicon substrate 1 with the p-n junction formed therein is used as the substrate and placed on the tray 100P as illustrated in FIGS. 16 and 17. The substrate 1T is placed such that the through hole h is positioned at the center of the substrate 1T. FIGS. 18(a) to 18(c) are sectional state diagrams illustrating placement of the substrate 1T up to film formation in the processes of forming the anti-reflective film by the plasma CVD apparatus.

In film formation, the tray 100P on which the substrate 1T is placed is placed on the support base 107 as illustrated in FIG. 18(a), and the film forming chamber 101 is evacuated by the evacuation unit 103 to $10^{-3}$ Torr to $10^{-5}$ Torr. In this case, the substrate is rapidly heated by lamp heating or the like so that the temperature is increased up to the film forming temperature in about one minute from the time the substrate 1T is placed in the film forming chamber 101, and then the film is formed immediately by the supply of source gas. At this time, warpage occurs in the substrate 1T as illustrated in FIG. 18(b) due to the difference in the coefficient of thermal expansion, thereby allowing the source gas to be more likely to go around through the gap. However, the through hole h formed in the tray 100P has a negative pressure; therefore, the substrate 1T is immediately attracted and fixed to the tray 100P with good adhesion as illustrated in FIG. 18(c). At this time, at the periphery of the substrate 1T, the elastic body 120 is pressed against the protrusion TS and attracted thereto with good contact, whereby the substrate 1T is fixed to the surface of the tray 100P with good adhesion. This prevents gas plasma from going around by the supply of source gas and can avoid film formation on the back surface 1B.

The above configuration allows the substrate to be fixed to the tray with good adhesion; therefore, selectivity can be further improved.

The elastic body 120 used here is desirably a mesh made of refractory metal that does not deteriorate at 900° C. to 1000° C. in a diffusion furnace. The refractory metal is desirably made of a metal material having a high melting point, particularly tungsten, tantalum, molybdenum, niobium, or an alloy of these metals. Elements include tungsten (3387° C.), rhenium (3180° C.), tantalum (2996° C.), osmium (2700° C.), molybdenum (2610° C.), niobium (2468° C.), iridium (2447° C.), boron (2300° C.), ruthenium (2250° C.), and hafnium (2150° C.) in the descending order of a melting point.

Sixth Embodiment

Figure 19:
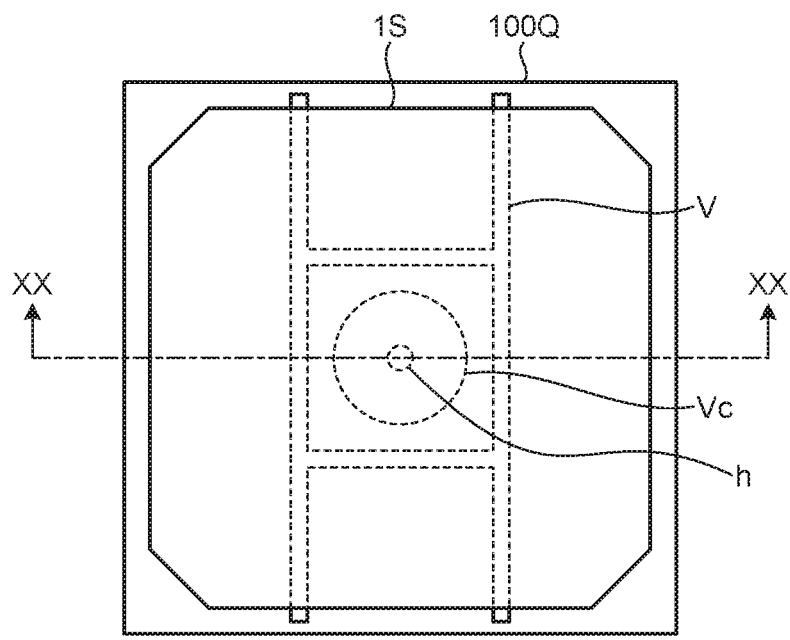
FIG. 19 is a top view illustrating a tray and a substrate on the tray in a solar cell manufacturing apparatus according to a sixth embodiment.

A sixth embodiment will describe a method of more reliably preventing a reactive gas from going around to the back surface of the semiconductor substrate by forming grooves on a tray 100Q of the CVD apparatus that is used in forming the anti-reflective film, to further increase adhesiveness. FIG. 19 is a top view illustrating a tray and a substrate placed on the tray in a solar cell manufacturing apparatus of the sixth embodiment, and FIG. 20 is a sectional view taken along line XX of FIG. 19 and illustrating the tray and the substrate placed on the tray in the solar cell manufacturing apparatus of the sixth embodiment.

Figure 20:
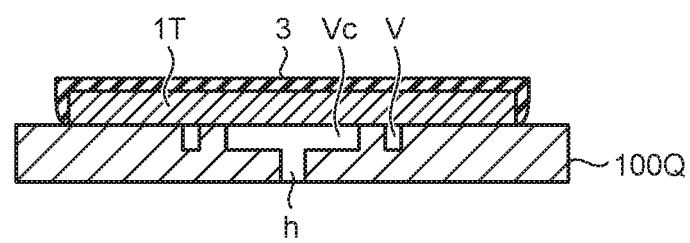
FIG. 20 is a sectional view taken along line XX of FIG. 19 and illustrating the tray and the substrate on the tray in the solar cell manufacturing apparatus according to the sixth embodiment.

As with the fourth embodiment, the solar cell manufacturing apparatus according to the sixth embodiment includes the through hole h and the grooves V formed on part of the surface of the tray 100Q in contact with the substrate 1T in the CVD apparatus that is used at the time of forming the anti-reflective film 3, as illustrated in FIGS. 19 and 20. The through hole h has an opening at the center of the contact surface with the substrate 1S. The grooves V provided on the surface of the tray 100Q of the solar cell manufacturing apparatus of the sixth embodiment include two vertical grooves V and two horizontal grooves V that are arranged orthogonal to each other into a double H shape, and a recess or a circular groove $V_c$ is provided in the center of a region enclosed by the two straight grooves V of the double H shaped groove V. The double H shaped groove V encloses the through hole h with the center of the through hole h as a center and has four ends protruding from the semiconductor substrate. The other configurations are similar to those of the first embodiment.

The manufacturing method for a solar cell according to the sixth embodiment further adds the double H shaped groove including four grooves V, i.e., the two vertical and two horizontal grooves orthogonal to each other, to the fourth embodiment, which is a combination of the first and second embodiments, thereby further enhancing the effect of the fourth embodiment.

In the first embodiment, the substrate 1S in the CVD apparatus receives, substantially at a single point, a relatively strong adhesion force in the vertical direction in the area corresponding to the through hole h, whereas in the CVD apparatus of the second embodiment, the adhesion force acts in the shape of the groove V, or across the surface, and the adhesion force is thus relieved. The tray 100U of the CVD apparatus of the fourth embodiment disperses the effect from the point to the direction of the surface.

Therefore, compared to the adhesion force acting on a point due to the through hole h of the first embodiment, the sixth embodiment can disperse the adhesion force along the entire surface of the substrate by further increasing the adhesion force of the grooves V relative to that of the fourth embodiment. Such dispersion of the adhesion force has the effect of further reducing the possibility that a very thin semiconductor substrate with a thickness of about 200 μm cracks at the time of attraction, as compared with the fourth embodiment.

Two of the four sides of the grooves are made shorter than the length of one side of the substrate 1S, that is, the grooves V are arranged in the shape of the double H instead of a hash mark (#), and thus do not protrude on two sides beyond the substrate 1S in order to prevent warpage of the tray by maintaining the strength of the tray 100Q that is reduced by forming grooves or holes and to achieve a good balance of adhesion force.

Figure 21:
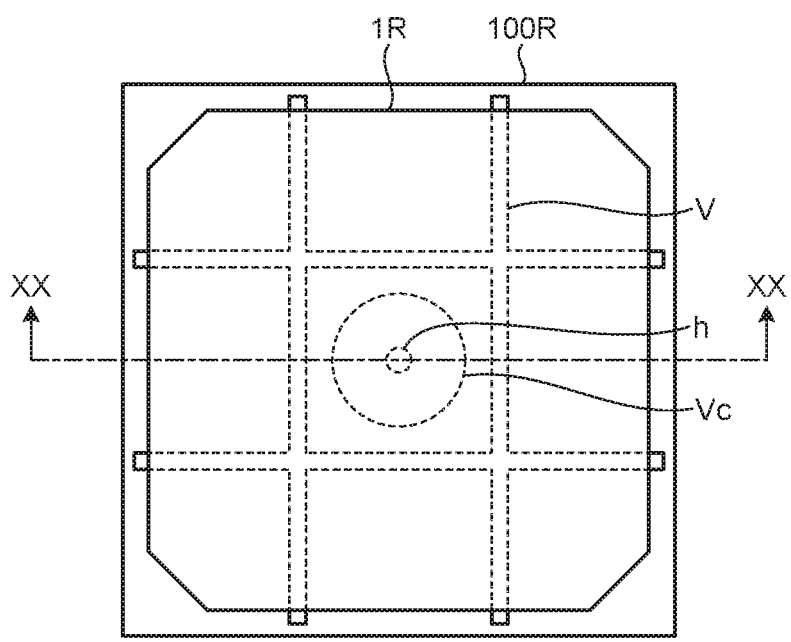
FIG. 21 is a top view illustrating a tray and a substrate on the tray in a solar cell manufacturing apparatus that employs a tray structure according to a variation of the sixth embodiment.

As a variation of the sixth embodiment, the grooves may be arranged in the shape of the hash mark as illustrated in FIG. 21 instead of the H. The grooves V arranged in the shape of the hash mark enclose the through hole h with the center of the through hole h as a center and have eight ends protruding from the semiconductor substrate 1R. That is, the grooves include four long grooves, two of which are orthogonal to the other two, where FIG. 21 is a top view illustrating a tray and a substrate placed on the tray in a solar cell manufacturing apparatus that employs a tray structure according to the variation of the sixth embodiment. A sectional view of the apparatus is similar to that of FIG. 20 and is thus omitted. The shape of the grooves can be selected as appropriate depending on the thickness of a substrate 1R to be used or the shape and material of a tray 100R.

The circular groove $V_c$ has the effect of spreading the adhesion force acting on the point through the through hole h into a circular surface. Moreover, when the pressure in the CVD apparatus is to be returned to the atmospheric pressure after the treatment, the substrate 1S or 1R and the tray 100Q or 100R are released from being in close contact with each other through the through hole h, the grooves V, or the circular groove $V_c$ by an increase in the pressure in the through hole h, the grooves V, or the circular groove $V_c$ from the reduced pressure to the atmospheric pressure. At this time, the circular groove $V_c$ having a certain area in the center of the substrate can more easily allow the substrate and the tray to be released from the close contact therebetween; therefore, the substrate 1S or 1R can be easily withdrawn into a storage carrier. Note that only the through hole h and the grooves V may be formed without the circular groove $V_c$ being formed.

As described above, the solar cell and a solar cell module using the solar cell according to the present invention have excellent light collection efficiency and are particularly suitable for a solar cell module installed in a place where it is difficult to use a light collecting auxiliary member such as a reflector.

Although the solar cell manufacturing apparatus according to the present invention is particularly effective for manufacturing the anti-reflective film in a solar cell, the apparatus can certainly be applied to a process of forming a thin conductive film in a solar cell or a process of forming a thin semiconductor film such as a p-type amorphous silicon film or an n-type amorphous silicon film in the processes of manufacturing a semiconductor device other than a solar cell.

The configurations illustrated in the aforementioned embodiments merely illustrate examples of the content of the present invention, and can thus be combined with another known technique or partially omitted and/or modified without departing from the scope of the present invention.

REFERENCE SIGNS LIST 1 p-type single crystal silicon substrate; 1S, 1T, 1R substrate; T texture; 1A light receiving surface; 1B back surface; 1C side surface; 2 n-type diffusion layer; 3 anti-reflective film; 3S thin portion; 4 finger electrode; 5 bus electrode; 6 BSF layer; 7 back surface collector electrode; 8 output extraction electrode; 10 solar cell; 100, 100S, 100T, 100U, 100P, 100Q, 100R tray; 101 film forming chamber; 102 evacuation portion; 103 evacuation unit; 104 gas supply portion; 105 diffusion chamber; 106 showerhead electrode; 107 support base; 108 facing surface; 109 outlet; 110 recessed groove; 120 elastic body; V groove; $V_c$ circular groove.

The invention claimed is:

1. A manufacturing method for a solar cell, the method comprising:
  forming a semiconductor layer of a second conductivity type on a crystalline semiconductor substrate of a first conductivity type; and
  forming a thin film by a CVD method such that the thin film extends from a light receiving surface side of the semiconductor substrate to a side surface of the semiconductor substrate, by placing the semiconductor substrate on a mount provided in a film forming chamber with the semiconductor substrate brought into contact with the mount, by evacuating and decompressing the film forming chamber, and by supplying a source gas into the film forming chamber, wherein
  the mount has a through hole that has an opening in a first contact surface of the mount contacting a second contact surface of the semiconductor substrate, passes through the mount, and opens into the film forming chamber at another end, wherein the through hole is the only through hole of the mount in the first contact surface of the mount, and the opening is the only opening of the through hole in the first contact surface of the mount,
  the CVD method causes a warping force on the semiconductor substrate directed away from the first contact surface of the mount at a center of the second contact surface of the semiconductor, and the forming of the thin film includes forming the thin film on surfaces of the semiconductor substrate excluding the second contact surface by bringing the semiconductor substrate into contact with the first contact surface by the evacuating and decompressing of the film forming chamber exerting a force countering the warping force on the semiconductor substrate.

2. The manufacturing method for a solar cell according to claim 1, wherein the forming of the thin film includes:

a first decompression of evacuating the film forming chamber to reduce a pressure in the film forming chamber to a first pressure and causing the through hole or a groove of the mount to have a negative pressure relative to the pressure in the film forming chamber;

a second decompression of further reducing the pressure to a second pressure and bringing the semiconductor substrate into contact with the mount; and a source gas supplying of supplying the source gas into the film forming chamber.

3. The manufacturing method for a solar cell according to claim 2, wherein in the source gas supplying, the pressure in the film forming chamber is maintained at the first pressure or lower.

4. The manufacturing method for a solar cell according to claim 1, wherein the mount has a groove in addition to the through hole.

5. The manufacturing method for a solar cell according to claim 4, wherein the opening of the through hole is at a center of the contact surface with the semiconductor substrate, and the groove is a double H shaped groove that encloses the through hole with a center of the through hole as a center, and includes four orthogonal grooves with four ends located at both ends of two of the four orthogonal grooves protruding from the semiconductor substrate.

6. The manufacturing method for a solar cell according to claim 4, wherein the opening of the through hole is at a center of the contact surface with the semiconductor substrate, and the groove is a hash mark (#) groove that encloses the through hole with a center of the through hole as a center, and includes four orthogonal grooves with eight ends of the four orthogonal grooves protruding from the semiconductor substrate.

7. The manufacturing method for a solar cell according to claim 1, wherein the through hole is a tapered hole formed to have a larger cross-sectional area as the hole is farther away from the opening.

8. The manufacturing method for a solar cell according to claim 1, wherein the through hole includes:

a first hole provided on the first contact surface of the mount and having a first opening, the first opening being the opening of the through hole in the first contact surface of the mount; and a second hole provided on a back surface of the mount and having a second opening, wherein the first hole is communicated with the second hole, and a cross-sectional area of the first hole is larger than a cross-sectional area of the second hole.

9. The manufacturing method for a solar cell according to claim 1, wherein the first contact surface of the mount is flat.

10. A manufacturing method for a solar cell, the method comprising:

mounting a semiconductor substrate on a mount provided in a film forming chamber while bringing a second main surface of the semiconductor substrate into contact with the mount; and forming a thin film on a first main surface and a side surface of the semiconductor substrate by a CVD method while evacuating and decompressing the film forming chamber and supplying a source gas into the film forming chamber, wherein the mount includes:

a third main surface on which the semiconductor substrate is mounted;

a fourth main surface opposite the third main surface; and a through hole, the through hole includes:

a first opening on one end side of the mount in a first region of the third main surface, the first region being a region where the second main surface of the semiconductor substrate is brought into contact, the first opening being the opening of the through hole in the first contact surface of the mount, wherein the through hole is the only through hole of the mount in the first contact surface of the mount, and the first opening is the only opening of the through hole in the first contact surface of the mount; and a second opening on the other side of the mount on the fourth main surface and opened into the film forming chamber, at the mounting the semiconductor substrate, the semiconductor substrate is mounted on the mount so that the second main surface of the semiconductor substrate closes the first opening, the CVD method causes a warping force on the semiconductor substrate directed away from the third main surface of the mount at a center of the second contact surface of the semiconductor, and the forming of the thin film is performed by bringing the second main surface of the semiconductor substrate into contact with the third main surface of the mount, by the evacuating and decompressing of the film forming chamber exerting a force countering the warping force on the semiconductor substrate, and forming the thin film on the first main surface and the side surface of the semiconductor substrate excluding the second main surface of the semiconductor substrate.

11. The manufacturing method for a solar cell according to claim 10, wherein the third main surface of the mount is flat.

* * * * *